United States Patent
Chen et al.

(10) Patent No.: US 12,250,803 B2
(45) Date of Patent: Mar. 11, 2025

(54) DEVICE AND METHOD FOR TUNING THRESHOLD VOLTAGE

(71) Applicant: Taiwan Semiconductor Manufacturing Company, Ltd., Hsin-Chu (TW)

(72) Inventors: Chih-Hsuan Chen, Hsinchu (TW); Chia-Hao Pao, Kaohsiung (TW); Shih-Hao Lin, Hsinchu (TW)

(73) Assignee: TAIWAN SEMICONDUCTOR MANUFACTORING COMPANY, LTD., Hsinchu (TW)

( * ) Notice: Subject to any disclaimer, the term of this patent is extended or adjusted under 35 U.S.C. 154(b) by 549 days.

(21) Appl. No.: 17/461,572

(22) Filed: Aug. 30, 2021

(65) Prior Publication Data

US 2023/0066387 A1    Mar. 2, 2023

(51) Int. Cl.
*H10B 10/00* (2023.01)
*G11C 11/412* (2006.01)

(52) U.S. Cl.
CPC .......... *H10B 10/12* (2023.02); *H10B 10/125* (2023.02); *G11C 11/412* (2013.01)

(58) Field of Classification Search
None
See application file for complete search history.

(56) References Cited

U.S. PATENT DOCUMENTS

| | | | |
|---|---|---|---|
| 8,605,523 B2 | 12/2013 | Tao et al. |
| 8,630,132 B2 | 1/2014 | Cheng et al. |
| 8,760,948 B2 | 6/2014 | Tao et al. |
| 8,772,109 B2 | 7/2014 | Colinge |
| 8,785,285 B2 | 7/2014 | Tsai et al. |
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,963,258 B2 | 2/2015 | Yu et al. |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,520,482 B1 | 12/2016 | Chang et al. |
| 9,548,303 B2 | 1/2017 | Lee et al. |
| 9,576,814 B2 | 2/2017 | Wu et al. |

(Continued)

*Primary Examiner* — Khaja Ahmad
(74) *Attorney, Agent, or Firm* — HAYNES AND BOONE, LLP

(57) ABSTRACT

A Static Radom Access Memory (SRAM) cell includes a pass-gate transistor and a pull-down transistor. The pass-gate transistor includes a first active region and a first gate structure engaging the first active region. The pull-down transistor includes a second active region and a second gate structure engaging the second active region. The SRAM cell further includes a first isolation feature abutting the first gate structure and a second isolation feature abutting the second gate structure. The first isolation feature is spaced from the first active region of the pass-gate transistor for a first distance. The second isolation feature is spaced from the second active region of the pull-down transistor for a second distance that is larger than the first distance.

20 Claims, 10 Drawing Sheets

(56) References Cited

U.S. PATENT DOCUMENTS

| | | | |
|---|---|---|---|
| 9,780,097 B2* | 10/2017 | Lee | H01L 27/0924 |
| 2013/0285116 A1 | 10/2013 | Lochtefeld et al. | |
| 2014/0032871 A1 | 1/2014 | Hsu et al. | |
| 2014/0153321 A1 | 6/2014 | Liaw | |
| 2014/0153345 A1 | 6/2014 | Kim et al. | |
| 2014/0177352 A1 | 6/2014 | Lum | |
| 2014/0233330 A1 | 8/2014 | Ko et al. | |
| 2014/0241077 A1 | 8/2014 | Katoch et al. | |
| 2014/0269114 A1 | 9/2014 | Yang et al. | |
| 2016/0005737 A1* | 1/2016 | Hooker | H01L 21/02178 |
| | | | 257/369 |
| 2016/0133632 A1* | 5/2016 | Park | H01L 29/66545 |
| | | | 257/369 |
| 2017/0033102 A1* | 2/2017 | Kim | H01L 27/0207 |
| 2017/0229468 A1* | 8/2017 | Yang | H10B 10/12 |
| 2017/0256548 A1* | 9/2017 | Hsu | H01L 27/0207 |
| 2017/0256549 A1* | 9/2017 | Keng | H01L 29/7827 |
| 2017/0338233 A1* | 11/2017 | Huang | H01L 21/823821 |

* cited by examiner

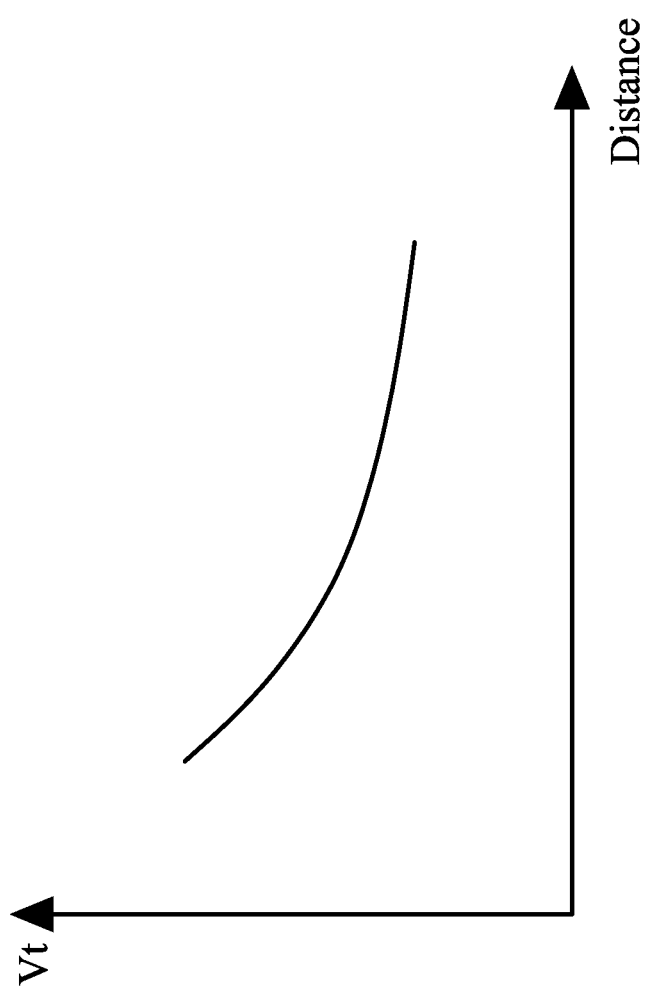

DEVICE AND METHOD FOR TUNING THRESHOLD VOLTAGE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of a polysilicon gate with a metal gate to improve device performance with the decreased feature sizes. One process of forming a metal gate is termed a replacement gate or "gate-last" process in which the metal gate is fabricated "last" which allows for reduced number of subsequent processes. In a "gate-last" process, various metal layers, such as work function metal layers and metal fill layers, are deposited in a gate trench that is formed in a place reserved by a dummy gate. By way of example, a metal gate fabrication process may include a metal gate structure deposition followed by a subsequent metal gate structure cutting process. The metal gate structure cutting process separates the metal gate into two or more gate segments. Each gate segment functions as a metal gate for an individual transistor. An isolation material is subsequently filled into trenches between adjacent portions of the metal gate.

Multi-gate transistors are compatible with a "gate-last" process and a metal gate cutting process. A typical multi-gate transistor is fabricated with a thin fin-like structure that provides an active region of the transistor. The fin-like structure usually includes at least one fin continuously extending from a substrate (also known as FinFET device) or a stack of nanostructures (e.g., nanosheets or nanowires) suspended above a substrate (also known as gate-all-around (GAA) device). The channel of the transistor is formed in this vertical fin-like structure. A metal gate is provided over (e.g., wrapping around) the fin-like structure. This type of gate allows greater control of the channel. Other advantages of multi-gate transistors include reduced short channel effect and higher current flow. However, existing multi-gate transistors still have shortcomings, for example shortcomings related to lack of threshold voltage (Vt) tuning options, which limits the IC circuit design freedom and could also degrade device performance. Particularly, in static random-access memory (SRAM) cells, unbalanced Vt in pass-gate transistors and pull-down transistors may deteriorate circuit performance. An object of the present disclosure seeks to resolve this issue, among others, by providing a Vt tuning option during metal gate structure cutting process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 7 is a graph illustrating a relationship between threshold voltage and a distance according to an embodiment of the present disclosure.

DETAILED DESCRIPTION

Figure 1:
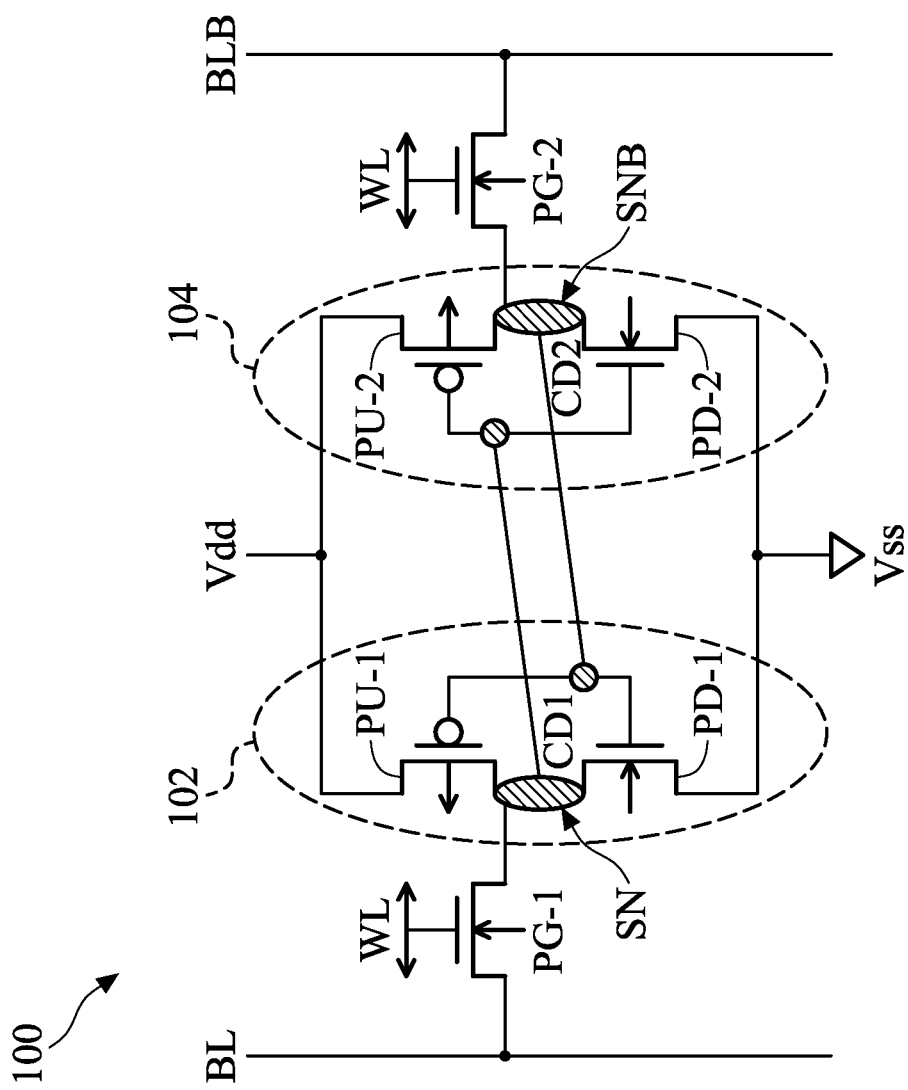
FIG. 1 is a circuit diagram of a SRAM cell, which can be implemented in a memory cell of a memory macro, according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices, and more particularly to forming transistors in NFET regions and PFET regions of a memory device (e.g., static random-access memory (SRAM) cells) by a metal gate fabrication process and tuning threshold voltage (Vt) of the transistors by a cut metal gate process.

A cut metal gate (CMG) process refers to a fabrication process where after a metal gate (e.g., a high-k metal gate or HK MG) replaces a dummy gate structure (e.g., a polysilicon gate), the metal gate is cut (e.g., by an etching process) to separate the metal gate into two or more gate segments. Each gate segment functions as a metal gate for an individual transistor. An isolation material is subsequently filled into trenches between adjacent portions of the metal gate. These trenches are referred to as cut metal gate trenches, or CMG trenches, in the present disclosure. To ensure a metal gate would be completely cut, CMG trenches often further extend into adjacent areas, such as dielectric layers between the metal gates. CMG trenches often have an elongated shape in a top view and are uniform in dimensions across the circuit. When an oxygen-containing etchant is used in forming CMG trenches, a spacing between CMG trenches and active regions (e.g., a fin-like structure in a multi-gate transistor) is often carefully selected in a way that the spacing prevents a diffusion of oxygen from sidewalls of the CMG trenches into a work function (WF) layer in the metal gate and thus safeguards a Vt of the transistor from shifting. However, intentionally introducing oxygen into a WF layer to cause partial oxidation of a WF metal during the formation of CMG trenches provides an option in fine tuning Vt of the transistors. For example, an SRAM cell often suffers from Vt mismatch issue between a pair of a pull-down transistor and a pass-gate transistor formed over a p-well region. Vt of a pass-gate transistor is often less than Vt of a pull-down transistor. By having an edge-to-edge distance between an active region of a pass-gate transistor and an adjacent CMG trench to be smaller than an edge-to-edge distance between an active region of a pull-down transistor and an adjacent CMG trench, a portion of the WF metal in the pass-gate transistor is oxidized, thereby increasing Vt of the pass-gate transistor to match Vt of the pull-down transistor in the pair.

FIG. 1 illustrates an exemplary circuit diagram of a SRAM cell 100, which can be a portion of a larger SRAM array, according to various aspects of the present disclosure. FIG. 1 has been simplified for the sake of clarity to better understand the inventive concepts of the present disclosure. Additional features can be added in SRAM cell 100, and some of the features described below can be replaced, modified, or eliminated in other embodiments of SRAM cell 100. For example, the illustrated SRAM cell 100 includes six transistors: a pass-gate transistor PG-1, a pass-gate transistor PG-2, a pull-up transistor PU-1, a pull-up transistor PU-2, a pull-down transistor PD-1, and a pull-down transistor PD-1. SRAM cell 100 is thus referred to as a 6-transistor (6-T) SRAM cell. The 6-T SRAM cell is used for illustration and to explain the features, but does not limit the embodiments or the appended claims. This non-limiting embodiment may be further extended to an 8-T SRAM cell, a 10-T SRAM cell, and to content addressable memory (CAM) cells.

In operation, pass-gate transistor PG-1 and pass-gate transistor PG-2 provide access to a storage portion of SRAM cell 100, which includes a cross-coupled pair of inverters, an inverter 102 and an inverter 104. Inverter 102 includes pull-up transistor PU-1 and pull-down transistor PD-1, and inverter 104 includes pull-up transistor PU-2 and pull-down transistor PD-2. In some implementations, pull-up transistors PU-1, PU-2 are configured as p-type field-effect transistors (PFETs), and pull-down transistors PD-1, PD-2 are configured as n-type filed-effect transistors (NFETs). In some implementations, pass-gate transistors PG-1, PG-2 are also configured as NFETs.

A gate of pull-up transistor PU-1 interposes a source (electrically coupled with a power supply voltage ($V_{DD}$) and a first common drain (CD1), and a gate of pull-down transistor PD-1 interposes a source (electrically coupled with a power supply voltage ($V_{SS}$)) and the first common drain. A gate of pull-up transistor PU-2 interposes a source (electrically coupled with power supply voltage ($V_{DD}$)) and a second common drain (CD2), and a gate of pull-down transistor PD-2 interposes a source (electrically coupled with power supply voltage ($V_{SS}$) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain (CD2). The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SNB respectively to bit lines BL, BLB in response to voltage applied to the gates of pass-gate transistors PG-1, PG-2 by WLs.

When SRAM cell 100 is read from, a positive voltage is placed on the word line WL, and the pass gates PG-1 and PG-2 allow the bit lines BL and BLB to be coupled to, and receive the data from, the storage nodes SN and SNB. Unlike a dynamic memory or DRAM cell, a SRAM cell does not lose its stored state during a read, so no data "write back" operation is required after a read. The bit lines BL and BLB form a complementary pair of data lines. As is known to those skilled in the art, these paired data lines may be coupled to a differential sense amplifier (not shown); and the differential voltage read from SRAM cells can be sensed and amplified, as is known in the art. This amplified sensed signal, which is at a logic level voltage, may then be output as read data to other logic circuitry in the device.

Figure 2:
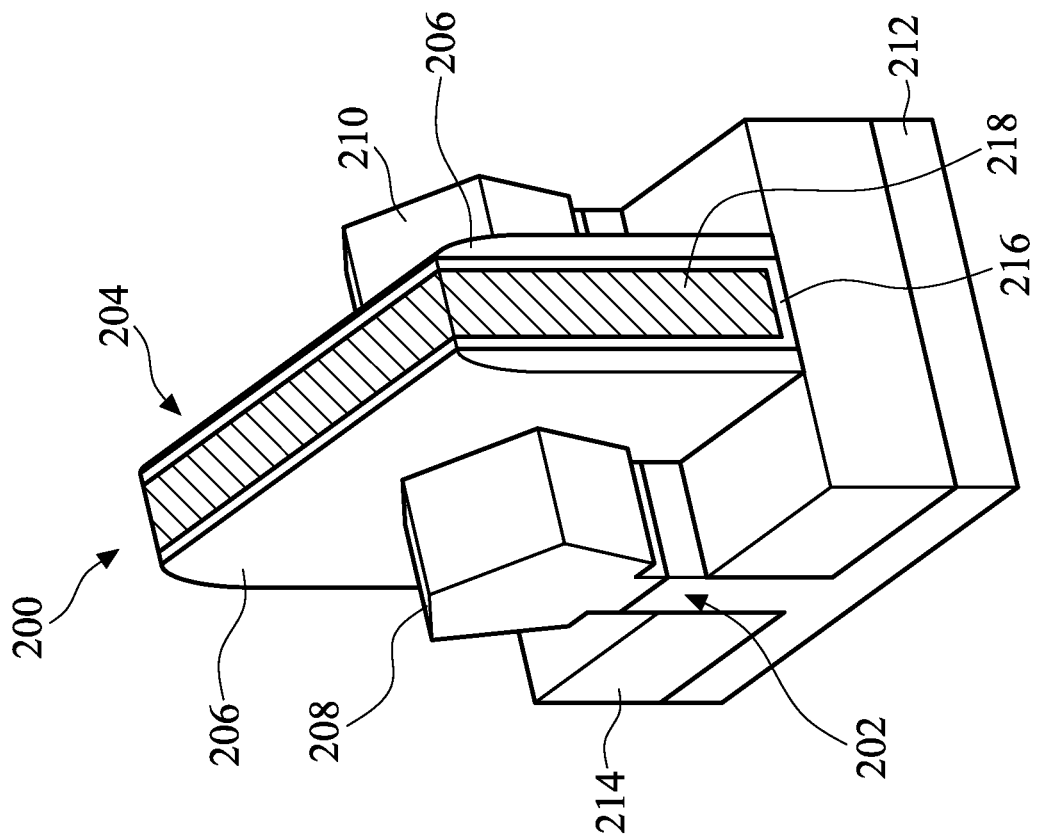
FIG. 2 is a perspective view of a multi-gate transistor, in accordance with some embodiments.

FIG. 2 illustrates a perspective view of a fin-based multi-gate transistor 200 relating to an embodiment of the present disclosure, which can be employed to implement any of the transistors in SRAM cell 100 shown in FIG. 1, including pull-up transistor PU-1, pull-up transistor PU-2, pull-down transistor PD-1, pull-down transistor PD-2, pass-gate transistor PG-1, and pass-gate transistor PG-2. A typical multi-gate transistor is fabricated with a thin fin-like structure that provides an active region of the transistor. The fin-like structure provides an active region for multi-gate transistor 200. In some embodiments, the fin-like structure is a continuous fin protruding from a substrate as an active region and fin-based multi-gate transistor 200 is referred to as a Fin field-effect transistor (FinFET). In some embodiments, the fin-like structure includes vertically-stacked horizontally-oriented nanostructures (e.g., nanowires or nanosheets) as an active region and fin-based multi-gate transistor 200 is a gate-all-around (GAA) transistor that includes. In the present disclosure, the fin-like structure is termed as a "fin." The term "fin" as used herein refers to either a continuous fin in a FinFET or a stack of nanostructures (e.g., nanowires or nanosheets) forming a fin-like shape in a GAA transistor. In the illustrated embodiment, fin-based multi-gate transistor 200 includes a fin 202, a gate structure 204, spacers 206, a drain region 208, and a source region 210. For example, fin 202 represents semiconductor fins 320A, 320B, 320C, 320D, 320E, 320F, 320G, 320H, and 320I in a layout 300 of SRAM cell 100 shown in FIG. 3.

Fin 202 extends above a semiconductor substrate 212. In some embodiments, semiconductor substrate 212 and fin 202 are made of the same material. For example, the substrate is a silicon substrate. In some instances, the substrate includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the substrate is a silicon on insulator (SOI) layer substrate or a silicon on sapphire (SOS) substrate. In some embodiments, semiconductor substrate 212 and fin 202 are made of different materials.

Fin 202 may be patterned by any suitable method. For example, fin 202 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern fin 202.

In some embodiments, fin 202 may be surrounded by isolating features 214 formed on opposite sides of fin 202. Isolating features 214 may electrically isolate an active region of fin-based multi-gate transistor 200 from other active regions. In some embodiments, isolating features 214 are shallow trench isolation (STI), field oxide (FOX), or another suitable electrically insulating structure.

Still referring to FIG. 2, in some embodiments, gate structure 204, which includes a gate dielectric 216 and a gate electrode 218 formed over gate dielectric 216. In a FinFET, gate structure 204 is positioned over sidewalls and a top surface of fin 202. In a GAA transistor, gate structure 204 wraps around each of the staked nanostructures (e.g., nanowire or nanosheet) in the fin-like structure. Therefore, a portion of fin 202 overlaps gate structure 204 may serve as a channel region. In some embodiments, gate dielectric 216 is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode 218 is made of a conductive material, such as aluminum (Al), copper (Cu), tungsten (W), titanium (Ti), tantalum (Ta), or another applicable material.

In some embodiments, spacers 206 of fin-based multi-gate transistor 200 are positioned over sidewalls and a top surface of fin 202. In addition, spacers 206 may be formed on opposite sides of gate structure 204. In some embodiments, spacers 206 are made of silicon nitride, silicon oxynitride, silicon carbide, another suitable material, or a combination thereof.

In some embodiments, portions of fin 202 that are not covered by gate structure 204 and spacers 206 serve as a drain region 208 and a source region 210. In some embodiments, drain region 208 and source region 210 of PFETs, for example, pull-up transistor PU-1 and pull-up transistor PU-2 are formed by implanting the portions of fin 202 that are not covered by gate structure 204 and spacers 206 with a p-type impurity such as boron, indium, or the like. In some embodiments, drain region 208 and source region 210 of NFETs, for example, pass-gate transistor PG-1, pass-gate transistor PG-2, pull-down transistor PD-1, and pull-down transistor PD-2 are formed by implanting the portions of fin 202 that are not covered by gate structure 204 and spacers 206 with an n-type impurity such as phosphorous, arsenic, antimony, or the like.

In some embodiments, drain region 208 and source region 210 are formed by etching portions of fin 202 that are not covered by gate structure 204 and spacers 206 to form recesses, and growing epitaxial regions in the recesses. The epitaxial regions may be formed of Si, Ge, SiP, SiC, SiPC, SiGe, SiAs, InAs, InGaAs, InSb, GaAs, GaSb, InAlP, InP, C, or a combination thereof. Accordingly, drain region 208 and source region 210 may be formed of silicon germanium (SiGe) in some exemplary embodiments, while the remaining fin 202 may be formed of silicon. In some embodiments, p-type impurities are in-situ doped in drain region 208 and source region 210 during the epitaxial growth of drain region 208 and source region 210 of PFETs, for example, pull-up transistor PU-1 and pull-up transistor PU-2 in FIG. 1. In addition, n-type impurities are in-situ doped in drain region 208 and source region 210 during the epitaxial growth of drain region 208 and source region 210 of NFETs, for example, pass-gate transistor PG-1, pass-gat transistor PG-2, pull-down transistor PD-1, and pull-down transistor PD-2 in FIG. 1.

In some alternative embodiments, pass-gate transistors PG-1/PG-2, pull-up transistors PU-1/PU-2, and pull-down transistors PD-1/PD-2 of SRAM cell 100 in FIG. 1 are planar MOS devices.

Figure 3:
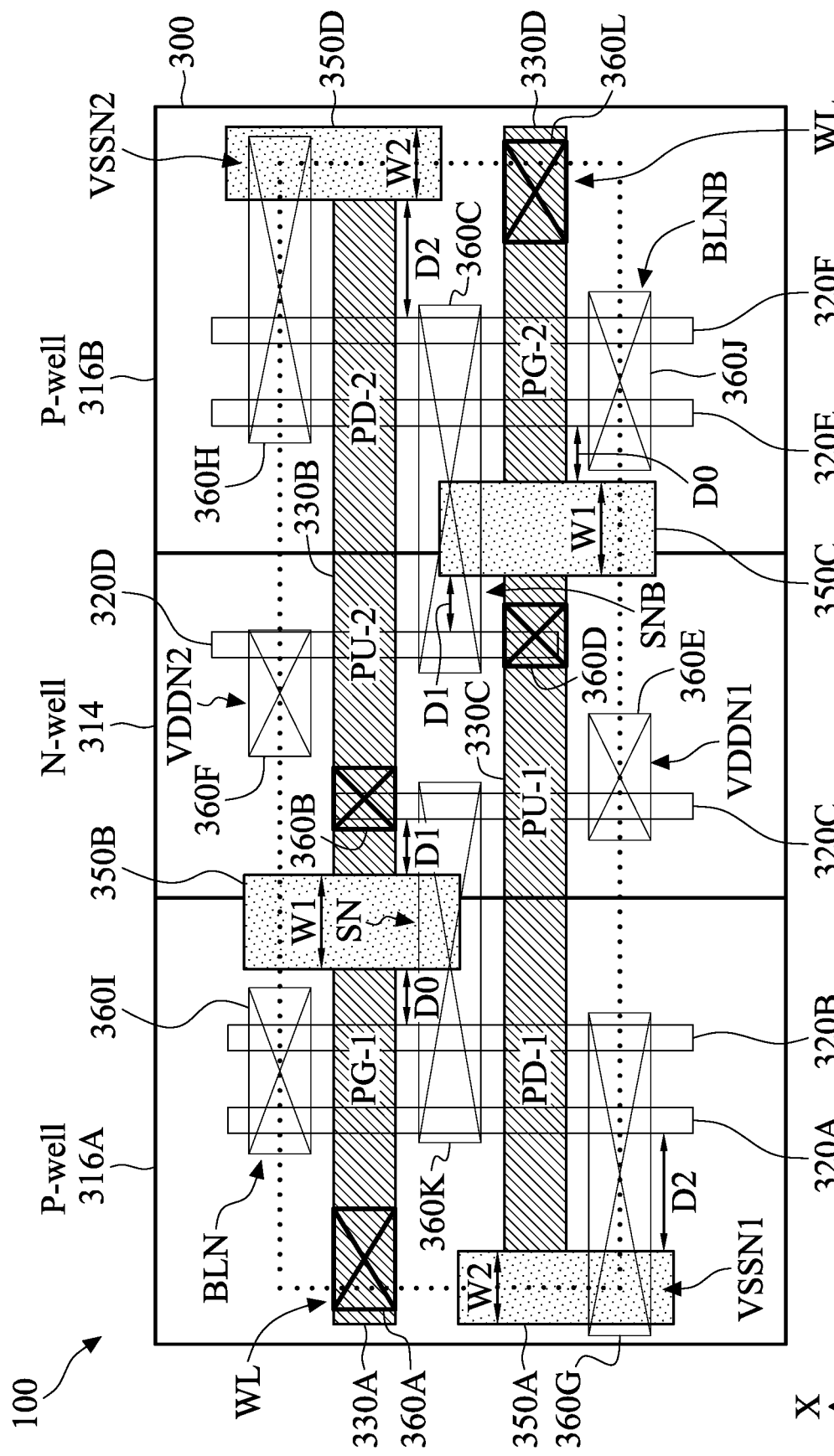
FIG. 3 is a plan view of a SRAM cell, which can be implemented in a memory cell of a memory macro, according to various aspects of the present disclosure.

FIG. 3 illustrates a layout 300 of SRAM cell 100, of which the circuit diagram is shown in FIG. 1, according to various aspects of the present disclosure. FIG. 3 has been simplified for the sake of clarity to better understand the inventive concepts of the present disclosure. For example, for convenience of illustration, the simplified layout 300 shown in FIG. 3 only illustrates a layout of wells, fins, gate structures, contacts formed on fins, gate contacts formed on gate structures, and gate isolation features in CMG trenches that "cut" gate structures into segments. One of ordinary skill in the art should also understand that for the purpose of illustration, FIG. 3 only shows one exemplary configuration of a layout of a 6-T SRAM cell. Additional features can be added in layout 300, and some of the features described below can be replaced, modified, or eliminated corresponding to other embodiments of SRAM cell 100.

Still referring to FIG. 3, SRAM cell 100 includes six transistors: a pass-gate transistor PG-1, a pass-gate transistor PG-2, a pull-up transistor PU-1, a pull-up transistor PU-2, a pull-down transistor PD-1, and a pull-down transistor PD-1. Layout 300 thus represents a layout of a 6-T SRAM cell. SRAM cell 100 includes a region 314 that provides an n-well between a region 316A and a region 316B that each provides a p-well (collectively as region 316). Pull-up transistors PU-1, PU-2 are disposed over the region 314;

pull-down transistor PD-1 and pass-gate transistor PG-1 are disposed over the region 316A; and pull-down transistor PD-2 and pass-gate transistor PG-2 are disposed over the region 316B. In some implementations, pull-up transistors PU-1, PU-2 are configured as PFETs, and pull-down transistors PD-1, PD-2 and pass-gate transistors PG-1, PG-2 are configured as NFETs. In some embodiments, each transistor may be in a form similar to the fin-based multi-gate transistor 200 (FIG. 2).

Each of the transistors PG-1, PG-2, PU-1, PU-2, PD-1, and PD-2 includes an active region. In some embodiments, an active region includes a fin. In the illustrated embodiment, SRAM cell 100 includes a fin 320A, a fin 320B, a fin 320C, a fin 320D, a fin 320E, and a fin 320F (collectively, as fins 320) disposed over a semiconductor substrate. Fins 320 are extending lengthwise in a X-direction and oriented substantially parallel to one another. In some implementations, fins 320 are a portion of the semiconductor substrate (such as a portion of a material layer of the semiconductor substrate). For example, where the semiconductor substrate includes silicon, fins 320 include silicon and project upwardly and continuously from the semiconductor substrate. Alternatively, in some implementations, fins 320 are defined in one or more semiconductor material layers, overlying the semiconductor substrate. For example, fins 320 can include a stack of nanostructures (nanowires or nanosheets) vertically stacked over the semiconductor substrate.

Various gate structures are disposed over fins 320, such as a gate structure 330A, a gate structure 330B, a gate structure 330C, and a gate structure 330D (collectively, as gate structures 330). Gate structures 330 extend along the Y-direction (for example, substantially perpendicular to fins 320). Gate structures 330 wrap portions of fins 320, positioned such that the gate structures interpose respective source/drain regions of fins.

In the illustrated embodiment, pull-down transistor PD-1 and pass-gate transistor PG-1 are multi-fin FinFETs (including, for example, a fin 320A and a fin 320B), pull-up transistor PU-1 is a single fin FinFET (including, for example, a fin 320C), pull-up transistor PU-2 is a single fin FinFET (including, for example, a fin 320D), and pull-down transistor PD-2 and pass-gate transistor PG-2 are multi-fin FinFETs (including, for example, a fin 320E and a fin 320F). A gate structure 330A is disposed over fins 320A, 320B; a gate structure 330C is disposed over fins 320A-320D; a gate structure 330B is disposed over fins 320C-320F; and a gate structure 330D is disposed over fins 320E-320F. A gate of pass-gate transistor PG-1 is formed from gate structure 330A, a gate of pull-down transistor PD-1 is formed from gate structure 330C, a gate of pull-up transistor PU-1 is formed from gate structure 330C, a gate of pull-up transistor PU-2 is formed from gate structure 330B, a gate of pull-down transistor PD-2 is formed from gate structure 330B, and a gate of pass-gate transistor PG-2 is formed from gate structure 330D.

An S/D contact 360K electrically connects a drain region of pull-down transistor PD-1 (formed by fins 320A, 320B (which can include n-type epitaxial source/drain features)) and a drain region of pull-up transistor PU-1 (formed by fin 320C (which can include p-type epitaxial source/drain features)), such that a common drain of pull-down transistor PD-1 and pull-up transistor PU-1 form a storage node SN. A gate contact 360B electrically connects a gate of pull-up transistor PU-2 (formed by gate structure 330B) and a gate of pull-down transistor PD-2 (also formed by gate structure 330B) to storage node SN. An S/D contact 360C electrically connects a drain region of pull-down transistor PD-2 (formed by fins 320E, 320F (which can include n-type epitaxial source/drain features)) and a drain region of pull-up transistor PU-2 (formed by fin 320D (which can include p-type epitaxial source/drain features)), such that a common drain of pull-down transistor PD-2 and pull-up transistor PU-2 form a storage node SNB. A gate contact 360D electrically connects a gate of pull-up transistor PU-1 (formed by gate structure 330C) and a gate of pull-down transistor PD-1 (also formed by gate structure 330C) to storage node SNB. An S/D contact 360E electrically connects a source region of pull-up transistor PU-1 (formed by fin 320C (which can include p-type epitaxial source/drain features)) to a power supply voltage $V_{DD}$ at a voltage node VDDN1, and an S/D contact 360F electrically connects a source region of pull-up transistor PU-2 (formed by fin 320D (which can include p-type epitaxial source/drain features)) to power supply voltage $V_{DD}$ at a voltage node VDDN2. An S/D contact 360G electrically connects a source region of pull-down transistor PD-1 (formed by fins 320A, 320B (which can include n-type epitaxial source/drain features)) to a power supply voltage $V_{SS}$ at a voltage node VSSN1, and a device-level contact 360H electrically connects a source region of pull-down transistor PD-2 (formed by fins 320E, 320F (which can include n-type epitaxial source/drain features)) to power supply voltage $V_{SS}$ at a voltage node VSSN2. A S/D contact 360I electrically connects a source region of pass-gate transistor PG-1 (formed by fins 320A, 320B (which can include n-type epitaxial source/drain features)) to a bit line (generally referred to as a bit line node BLN), and an S/D contact 360J electrically connects a source region of pass-gate transistor PG-2 (formed by fins 320E, 320F (which can include n-type epitaxial source/drain features)) to a complementary bit line (generally referred to as a bit line node BLNB). A gate contact 360A electrically connects a gate of pass-gate transistor PG-1 (formed by gate structure 330A) to a word line WL (generally referred to as a word line node WL), and a gate contact 360L electrically connects a gate of pass-gate transistor PG-2 (formed by gate structure 330D) to the word line.

Still referring to FIG. 3, SRAM cell 100 further includes a plurality of dielectric features extending lengthwise along the X-direction, including a dielectric feature 350A, a dielectric feature 350B, a dielectric feature 350C, and a dielectric feature 350D (collectively, dielectric features 350 or referred to as isolation features 350). In the illustrated embodiment, the dielectric feature 350B is disposed between fin 320B and fin 320C and abuts gate structure 330A and gate structure 330B. The dielectric feature 350B divides an otherwise continuous gate structure into two isolated segments corresponding to gate structure 330A and gate structure 330B. The dielectric feature 350C is disposed between fin 320D and fin 320E and abuts gate structure 330C and gate structure 330D. The dielectric feature 350C divides an otherwise continuous gate structure into two isolated segments corresponding to gate structure 330C and gate structure 330D. The dielectric feature 350A is disposed near an edge of SRAM cell 100 and abuts gate structure 330C. the dielectric feature 350A divides gate structure 330C from adjoining other gate structure from an adjacent SRAM cell. The dielectric feature 350D is disposed near another edge of SRAM cell 100 and abuts gate structure 330B. the dielectric feature 350D divides gate structure 330B from adjoining other gate structure from an adjacent SRAM cell. Each of the dielectric features 350 is formed by filling a corresponding CMG trench in the position of the dielectric features. In the illustrated embodiment, from a top view, dielectric feature 350B is disposed above an interface between n-well region 314 and p-well region 316A, dielectric feature 350C is disposed above an interface between n-well region 314 and p-well region 316B, dielectric feature 350A is disposed completely above p-well region 316A, and dielectric feature 350D is disposed completely above p-well region 316B. Alternatively, dielectric feature 350A and dielectric feature 350B may be both disposed completely above p-well region 316A, and dielectric feature 350C and dielectric feature 350D may be both disposed completely above p-well region 316B.

In a top view as shown in FIG. 3, dielectric feature 350B has a critical dimension (CD, also referred to as width W1 along Y-direction), an edge-to-edge distance D0 along Y-direction to adjacent fin 320B above p-well region 316A, and an edge-to-edge distance D1 along Y-direction to adjacent fin 320C above n-well region 314. Dielectric feature 350C has a width W1 along Y-direction, an edge-to-edge distance D0 along Y-direction to adjacent fin 320E above p-well region 316B, and an edge-to-edge distance D1 along Y-direction to adjacent fin 320D above n-well region 314. Dielectric feature 350A has a width W2 along Y-direction and an edge-to-edge distance D2 along Y-direction to adjacent fin 320A above p-well region 316A. Dielectric feature 350D has a width W2 along Y-direction and an edge-to-edge distance D2 along Y-direction to adjacent fin 320F above p-well region 316B. In some embodiments, distance D0 equals distance D1. In other words, dielectric feature 350B and is positioned in the middle of two adjacent fins, and dielectric feature 350C and is positioned in the middle of two adjacent fins. In some embodiments, distance D0 is smaller than distance D1. In other words, dielectric feature 350B is positioned closer to an adjacent fin in a p-well region than the other adjacent fin in an n-well region, and dielectric feature 350C is positioned closer to an adjacent fin in a p-well region than the other adjacent fin in an n-well region. In some embodiments, width W1 is larger than width W2. For example, a ratio of W1 over W2 may range from about 1.2:1 to about 2:1. In other words, dielectric feature 350B and dielectric feature 350C are wider than dielectric feature 350A and dielectric feature 350C. The larger widths of dielectric feature 350B and dielectric feature 350C also reduce distance D0 compared to distance D2. In some embodiments, distance D0 is smaller than D2. For example, a ratio of D2 over D0 may range from about 1.5:1 to about 3:1. In other words, dielectric feature 350B is closer to its adjacent fin in an n-well region than that of the dielectric feature 350A, and dielectric feature 350C is closer to its adjacent fin in an n-well region than that of the dielectric feature 350D. The benefits of dimensional relationships among D0, D1, D2, W1, and W2 will become evident in a later section of the present disclosure.

Figure 4:
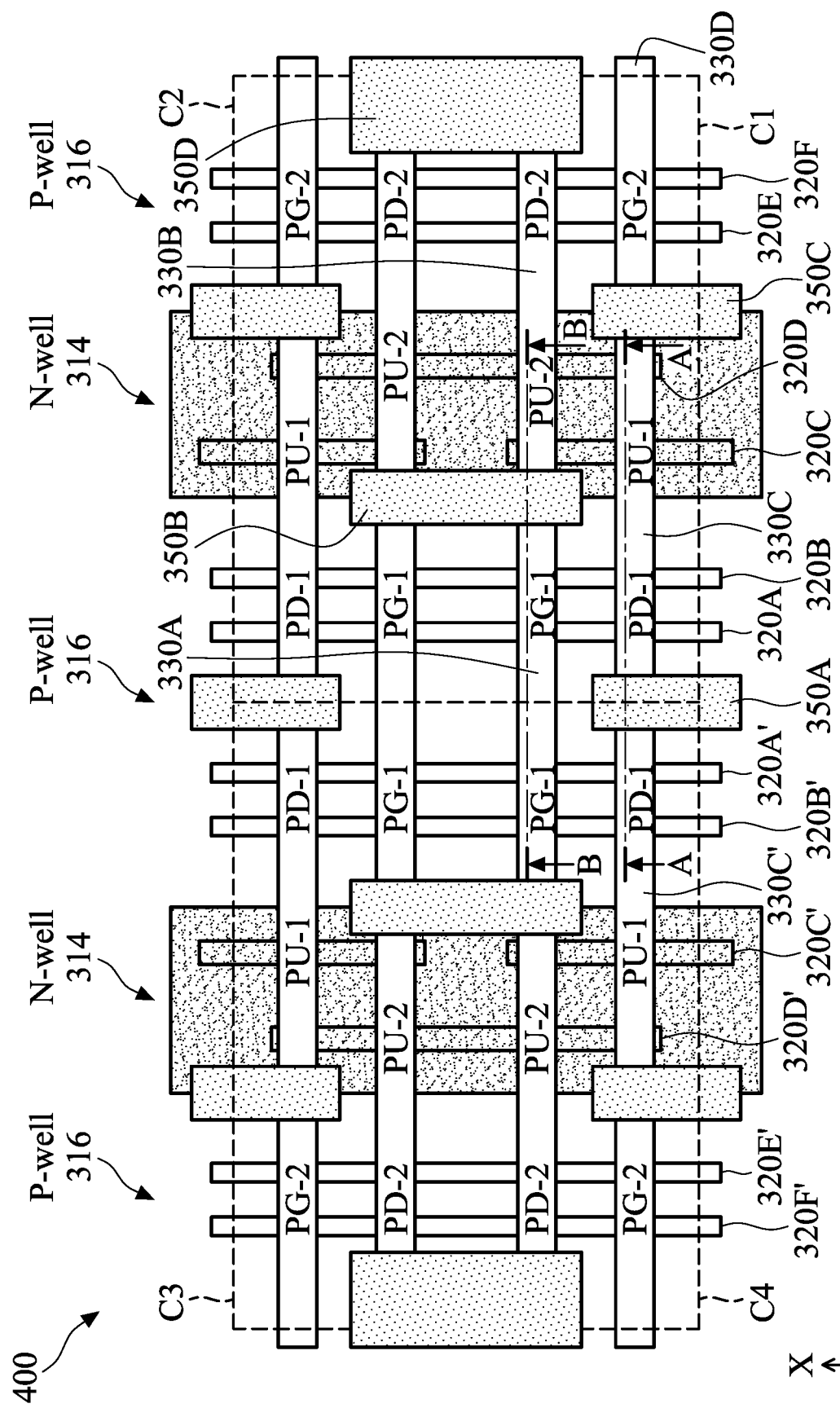
FIG. 4 is a plan view of a 2×2 memory array tiled by the SRM cell of FIG. 3.

FIG. 4 illustrates a layout 400 of an array of SRAM cells according to the present disclosure. Referring to FIG. 4, a plurality of SRAM cells C1, C2, C3, and C4 are arranged in the X-direction and the Y-direction, forming a 2×2 array of SRAM cells. In some embodiments, two adjacent SRAM cells in the X-direction are line symmetric with respect to a common boundary (represented by dotted lines in FIG. 4) therebetween and two adjacent SRAM cells in the Y-direction are line symmetric with respect to a common boundary therebetween. Each SRAM cell in the array may use layout 300 of SRAM cell 100 as depicted in FIG. 3 according to an embodiment. FIG. 4 has been simplified for the sake of clarity to better understand the inventive concepts of the present disclosure. For example, S/D contacts and gate contacts in a SRAM cell 100 as depicted in FIG. 3 are omitted. Also, reference numerals in FIG. 3 are also repeated in FIG. 4 for ease of understanding, such as fins 320A-320F, gate structures 330A-330D, and dielectric features 350A-350D.

The example 2×2 array includes regions 314 and 316. In the present embodiment, region 316 provides p-well for forming NFETs (including transistors PG-1, PD-1, PG-2, and PD-2) and region 314 provides n-well for forming PFETs (including transistors PU-1 and PU-2). Therefore, the region 316 is also referred to as the NFET region 316, and region 314 is also referred to as PFET region 314.

The example 2×2 array includes regions 314 and 316 alternately arranged along an x-direction. In other words, every PFET region 314 is next to an NFET region 316 which is next to another PFET region 314, and this pattern repeats. For ease of reference, a column is referred to as being in the Y-direction in this example. Thus, SRAM cells C1 and C2 are in a first column, and SRAM cells C3 and C4 are in a second column. As depicted above, adjacent cells in the array are mirror images along a common boundary between the adjacent cells. Some active regions in an SRAM cell may extend through multiple SRAM cells in a column. In FIG. 4, the active region (fins 320A and 320B) for transistors PG-1 and PD-1 in SRAM cell C1 extends through SRAM cell C2 as the active region for its transistors PD-1 and PG-1. The active region (fin 320D) for transistor PU-2 in SRAM cell C1 extends through SRAM cell C2 as the active region for its transistor PU-2. Similarly, the active region (fins 320E and 320F) for transistors PG-2 and PD-2 in SRAM cell C1 extends through SRAM cell C2 as the active region for its transistors PD-2 and PG-2. The active regions (denoted as fins 320A'-320F') extending through SRAM cell C3 and SRAM cell C4 are similarly arranged as their counterparts 320A-320F.

By having the SRAM cells in the configuration in FIG. 4, active regions can uniformly extend throughout an array of SRAM cells. For example, spacing between active regions in the Y-direction can be uniform. Further, some active regions can extend longitudinally across multiple SRAM cells without being interrupted by an isolation feature. This configuration can improve the uniformity of an array layout, and thereby, avoid lithography problems that may arise in forming the active region, particularly fins for FinFET or GAA device active regions and in small technology nodes. Similarly, gate structures can uniformly extend throughout an array of SRAM cells. For example, spacing between gate structures in the X-direction can be uniform. Further, some gate structures can extend longitudinally across multiple SRAM cells without being interrupted by an isolation feature. Some gate structures are divided into segments by dielectric features, such as dielectric features 350A-350D, which fill up CMG trenches formed by etching portions of the gate structures.

Figure 5A:
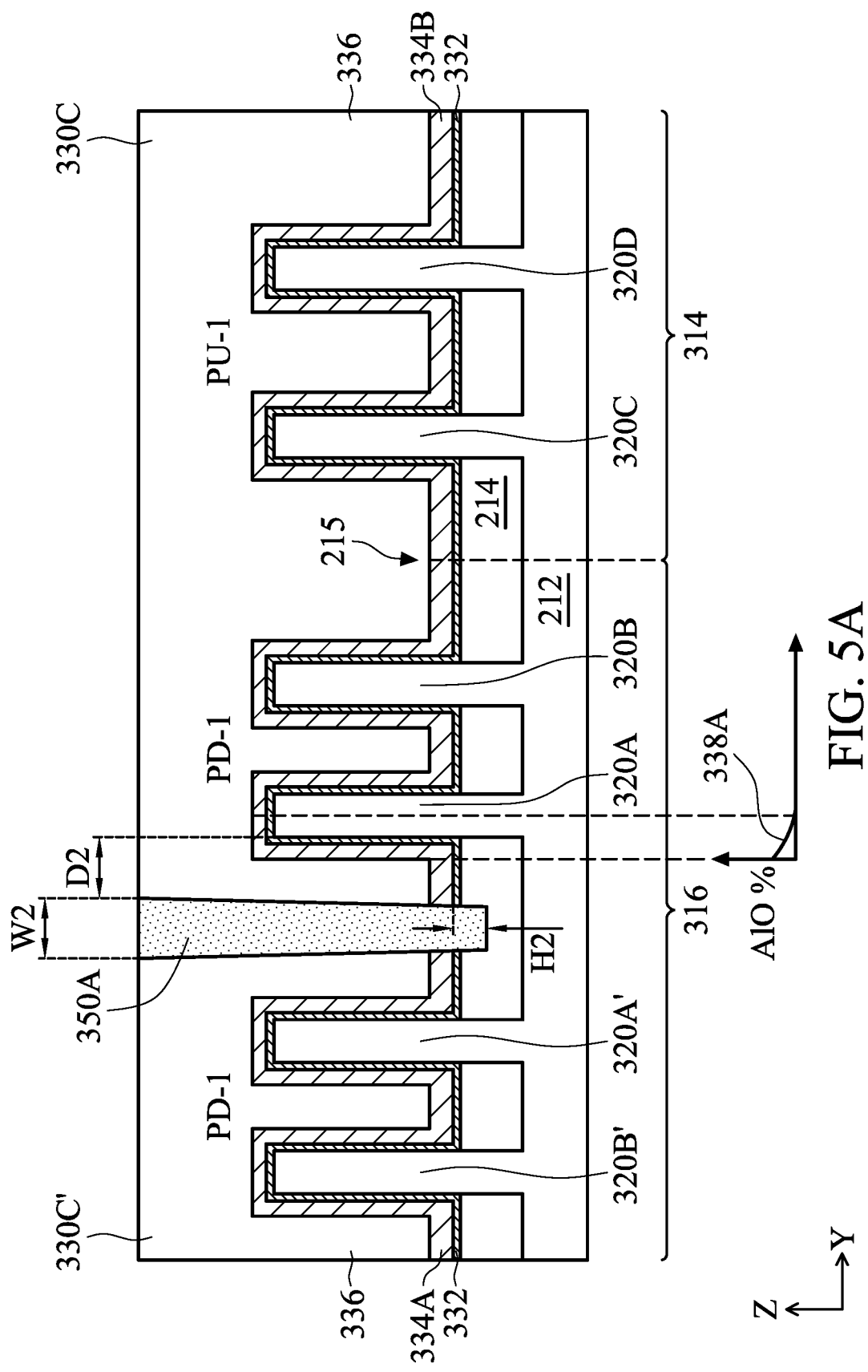
FIGS. 5A, 5B, 6A, and 6B illustrate cross-sectional views of a portion of the 2×2 memory array of FIG. 4, according to various embodiments of the present disclosure.
Figure 5B:
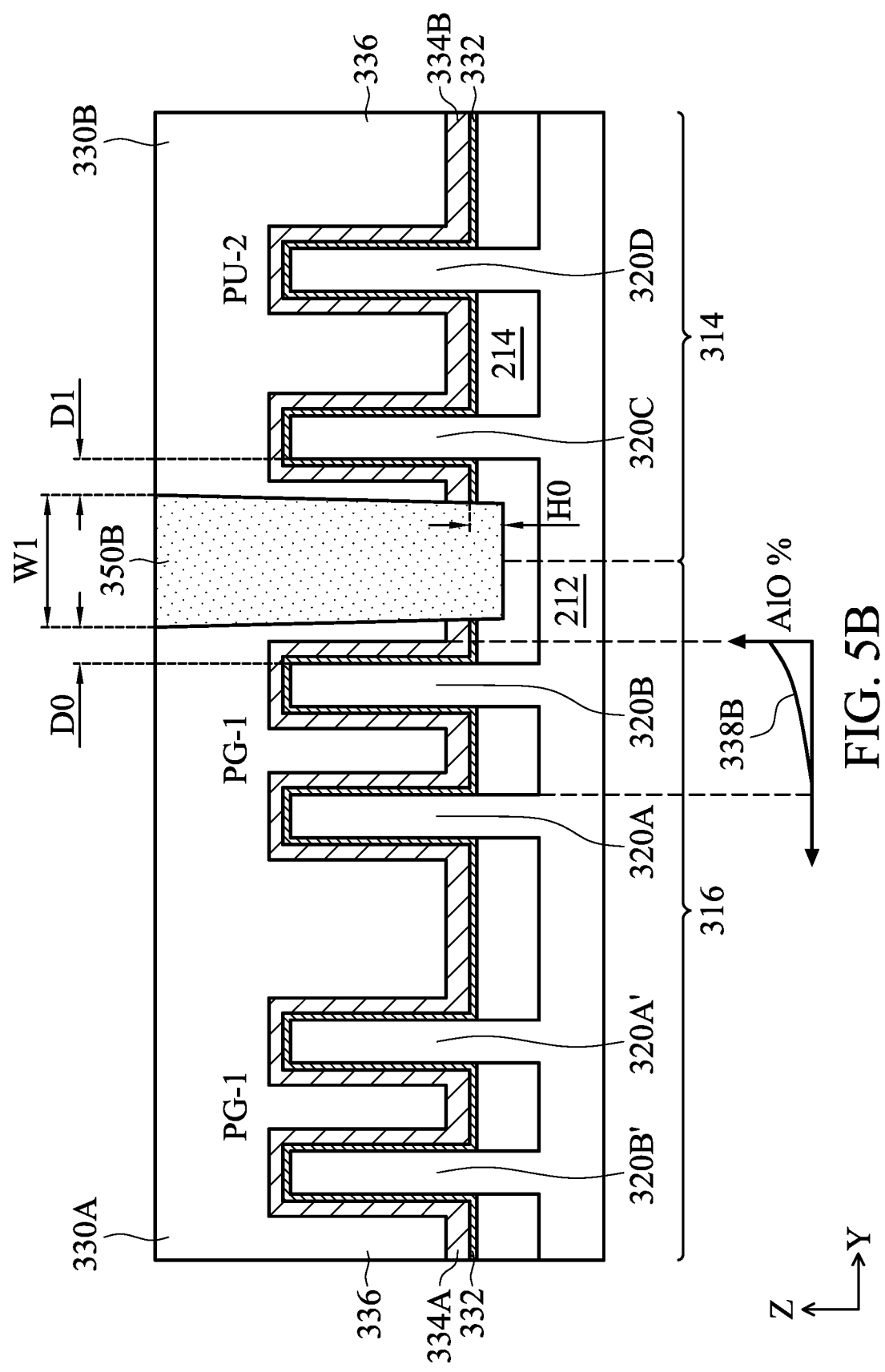

FIGS. 5A and 5B illustrate cross-sectional views along A-A line and B-B line in FIG. 4, respectively, according to an implementation of transistors with FinFETs. Particularly, FIG. 5A is a cross-sectional view across NFET region 316 and PFET region 314 along the lengthwise direction of a gate structure, which is disposed over action regions of pull-down transistor PD-1 of SRAM cell C4, pull-down transistor PD-1 of SRAM cell C1, pull-up transistor PU-1 of SRAM cell C1. Dielectric feature 350A divides the gate structure into segment 330C' over NFET region 316 and segment 330C over both NFET region 316 and PFET region 314. FIG. 5B is a cross-sectional view across NFET region 316 and PFET region 314 along the lengthwise direction of a gate structure, which is disposed over action regions of pass-gate transistor PG-1 of SRAM cell C4, pass-gate transistor PG-1 of SRAM cell C1, and pull-up transistor PU-2 of SRAM cell C1. Dielectric feature 350B divides the gate structure into segment 330A over NFET region 316 and segment 330B over PFET region 314.

Gate structures 330 include gate stacks configured to achieve desired functionality according to design requirements of SRAM cells, such that gate structures 330 include the same or different layers and/or materials. In the depicted embodiment, gate structures 330 have gate stacks that include a gate dielectric layer 332, a work function (WF) layer 334, and a metal fill layer 336. Gate dielectric layer 332 is conformally disposed over fins 320B'-320D and STI feature 214, such that gate dielectric layer 332 has a substantially uniform thickness. WF layer 334 is disposed over gate dielectric 332. WF layer 334 may be deposited by ALD, CVD, PVD, and/or other suitable methods. Metal fill layer 336 is disposed over WF layer 334. Metal fill layer 336 may include tungsten (W), cobalt (Co), molybdenum (Mo), ruthenium (Ru), nickel (Ni), copper (Cu), or other metals, and may be formed by CVD, PVD, ALD, plating, or other suitable processes.

WF layer 334 determines the work function of the high-k metal gates, and includes at least one layer, or a plurality of layers formed of different materials. The material of WF layer 334 is selected according to whether the respective transistor is an n-type transistor or a p-type transistor. WF layer 334 over NFET region 316 is herein denoted as WF layer 334A and WF layer 334 over PFET region 314 is herein denoted as WF layer 334B. WF layer 334A and WF layer 334B interface above the boundary 215 of NFET region 316 and PFET region 314.

In some embodiments, WF layer 334A may include a first sub WF layer (e.g., a TiN layer) and a second sub WF layer (e.g., a TiAl layer) over the first sub WF layer. The WF layer 334B may include a first sub WF layer (e.g., a TiN layer, a TaN layer, or a TiN layer over a TaN layer) and a second sub WF (e.g., a TiAl layer) over the first sub WF layer. In furtherance of some embodiments, each of the WF layers 334A and 334B includes a TiAl layer over a TiN layer, but with different thicknesses in NEFT and PFET regions to create different work functions. In one example, the TiN layer in WF layer 334A is thinner than the TiN layer in WF layer 334B, such as with a thickness ratio from about 1:1.1 to about 1:10. Such a range provides a good compromise of effective threshold voltage tuning and acceptable work function layer thickness, such that when the ratio is larger than 1:1.1 the threshold voltage of p-type transistor may become too high and when the ratio is smaller than 1:10, the thickness of the TiN layer in the PFET region 314 may become too thick to deposit in a high-aspect-ratio gate trench. Further, the TiAl layer in WF layer 334A is thicker than the TiAl layer in WF layer 334B, such as with a thickness ration from about 1.1:1 to about 10:1. Again, such a range provides a good compromise of effective threshold voltage tuning and acceptable work function layer thickness, such that when the ratio is smaller than 1.1:1 the threshold voltage of n-type transistor may become too high and when the ratio is larger than 10:1, the thickness of the TiAl layer in the NFET region 316 may become too thick to deposit in a high-aspect-ratio gate trench.

Due to a thicker TiAl layer, WF layer 334A has an overall higher Al concentration in molar ratio than WF layer 335B. The Al concentration difference at the boundary 215 of NFET region 316 and PFET region 314 causes Al diffusion from WF layer 334A of pull-down resistor PD-1 of SRAM cell C1 (particularly, fin 320B) to WF layer 334B of pull-up resistor PU-1 of SRAM cell C1, resulting in a lower Al concentration in WF layer 334A of pull-down resistor PD-1 of SRAM cell C1. As a comparison, although action regions of pass-gate transistor PG-1 and pull-down resistor PD-1 of SRAM cell C1 share the same fins (fin 320A and fin 320B), the dielectric feature 350B blocks Al diffusion path from WF layer 334A of pass-gate transistor PG-1 of SRAM cell C1 to PFET region 314. Accordingly, Al concentration in WF layer 334A of pass-gate transistor PG-1 of SRAM cell C1 remains substantially the same and is higher than that of the WF layer 334A of pull-down transistor PD-1.

Threshold voltage (Vt) of a transistor is affected by material concentration of a WF layer. For example, for n-type transistors with an Al-containing WF layer, smaller Al concentration leads to a higher Vt. State differently, although pass-gate transistor PG-1 and pull-down resistor PD-1 of SRAM cell C1 form a pair of transistors in which active regions share the same fins (fin 320A and fin 320B), Vt of pull-down resistor PD-1 is higher due to smaller Al concentration in its WF layer 334A, resulting in Vt mismatch inside the pair of transistors. Vt mismatch is often larger than 5%, which deteriorates SRAM cell performance. Vt mismatch is defined to be equal to an absolute value of $(V_{thPD-1} - V_{thPD-1})/V_{thPD-1} * 100\%$, in which $V_{thPD-1}$ is the threshold voltage of pull-down transistor PD-1 and $V_{thPG-1}$ is the threshold voltage of pass-gate transistor PG-1.

To compensate the Vt mismatch discussed above, dielectric feature 350B has a larger width (i.e., W1>W2), a deeper depth into STI feature 214 (H0>H2), and a smaller edge-to-edge distance to an opposing sidewall of a fin (i.e., D0<D2) than those of dielectric feature 350A. Dielectric features are formed by forming CMG trenches in an etching process and subsequently filling CMG trenches with dielectric materials. In some embodiments, the etching process in forming CMG trenches is a dry etching process with the use of a process gas mixture of sulfur fluoride (SF6) and oxygen (O2) as the dry etchant. In some other embodiments, the etching process in forming CMG trenches is a wet etching process with the use of aqueous potassium chloride (KOH) solution as the wet etchant. In these embodiments, as both the SF6/O2 gas mixture and the potassium chloride solution contain some forms of oxygen, they can be collectively referred to as oxygen-containing etchants or oxygen-atom-containing etchants.

By opening the CMG trench corresponding to dielectric feature 350B to be larger and deeper than the other CMG trench corresponding to dielectric feature 350A, oxygen atoms are easier to diffuse through sidewalls of the CMG trench and into the gate structure. By opening the CMG trench having a smaller edge-to-edge distance to an adjacent fin, oxygen atoms have a shorter distance to diffuse and are easier to arrive at WF layer 334A covering fin 320B. Subsequently, oxygen atoms react with a portion of aluminum atoms in WF layer 334A (e.g., a TiAl layer) and form aluminum-oxide-containing compound (e.g., TiAlOx). A higher percentage of Al in WF layer 334A of pass-gate transistor PG-1 of SRAM cell C1 is oxidized than that of pull-down transistor PD-1 of SRAM cell C1. In some embodiments, a concentration of about 20% to about 30% of overall aluminum in molar ratio in WF layer 334 of pass-gate transistor PG-1 of SRAM cell C1 is oxidized, while less than about 10% or even substantially zero percent aluminum in WF layer 334 of pull down transistor PD-1 of SRAM cell C1 is oxidized due to a large D2. In furtherance of some embodiments, a concentration of overall oxidized aluminum in molar ratio in WF layer 334 of pass-gate transistor PG-1 of SRAM cell C1 is at least about 50% larger than in WF layer 334 of pull-down transistor PD-1 of SRAM cell C1. Aluminum oxide has a gradient distribution which reduces at a larger distance away from the respective CMG trench, such as illustrated by plots 338A and 338B. Referring to plot 338A, due to a large D2, an aluminum oxide percentage quickly reduces to zero above a top surface of fin 320A. Referring to plot 338B, due to a small D0, even on a sidewall of fin 320A that is separated from dielectric feature 350B by fin 320B, there may be some aluminum oxide.

Oxidation of aluminum increases Vt of an NFET, and thus allows Vt of pass-gate transistor PG-1 of SRAM cell C1 to increase to match that of pull-down transistor PD-1 of SRAM cell C1. FIG. 7 illustrates a relationship between edge-to-edge distance between an CMG trench and an active region (e.g., a fin) and Vt. For example, when the distance is reduced, Vt increases, and vice versa. By adjusting dimensions of a CMG trench and eventually dimensions of dielectric features abutting gate structures, Vt mismatch in the pair of transistor PD-1 and PG-1 is less than 3%, which improves SRAM cell performance. In some embodiments, a ratio of D2 over D0 may range from about 1.5:1 to about 3:1. If the ratio is less than about 1.5:1, D0 may become too large to increase Vt effectively; if the ration is larger than about 3:1, D0 may become too small causing oxidizing a large portion of aluminum in a work function layer, which deteriorates work function tuning capability of a work function layer. In some embodiments, a ratio of W1 over W2 may range from about 1.2:1 to about 2:1. If the ratio is less than about 1.2:1, the opening of CMG trench corresponding to dielectric feature 350B may become too narrow for enough oxygen to enter the trench. If the ratio is larger than 2:1, the width of dielectric feature 350B may become too large to fit in spacing between fin 320B and fin 320C. In FIG. 5B, since the portion of fin 320C adjacent dielectric feature 350B does not provide an active region for a transistor, circuit performance is not sensitive to edge-to-edge distance D1, and D0 can either equal D1 or be smaller than D1.

Figure 6A:
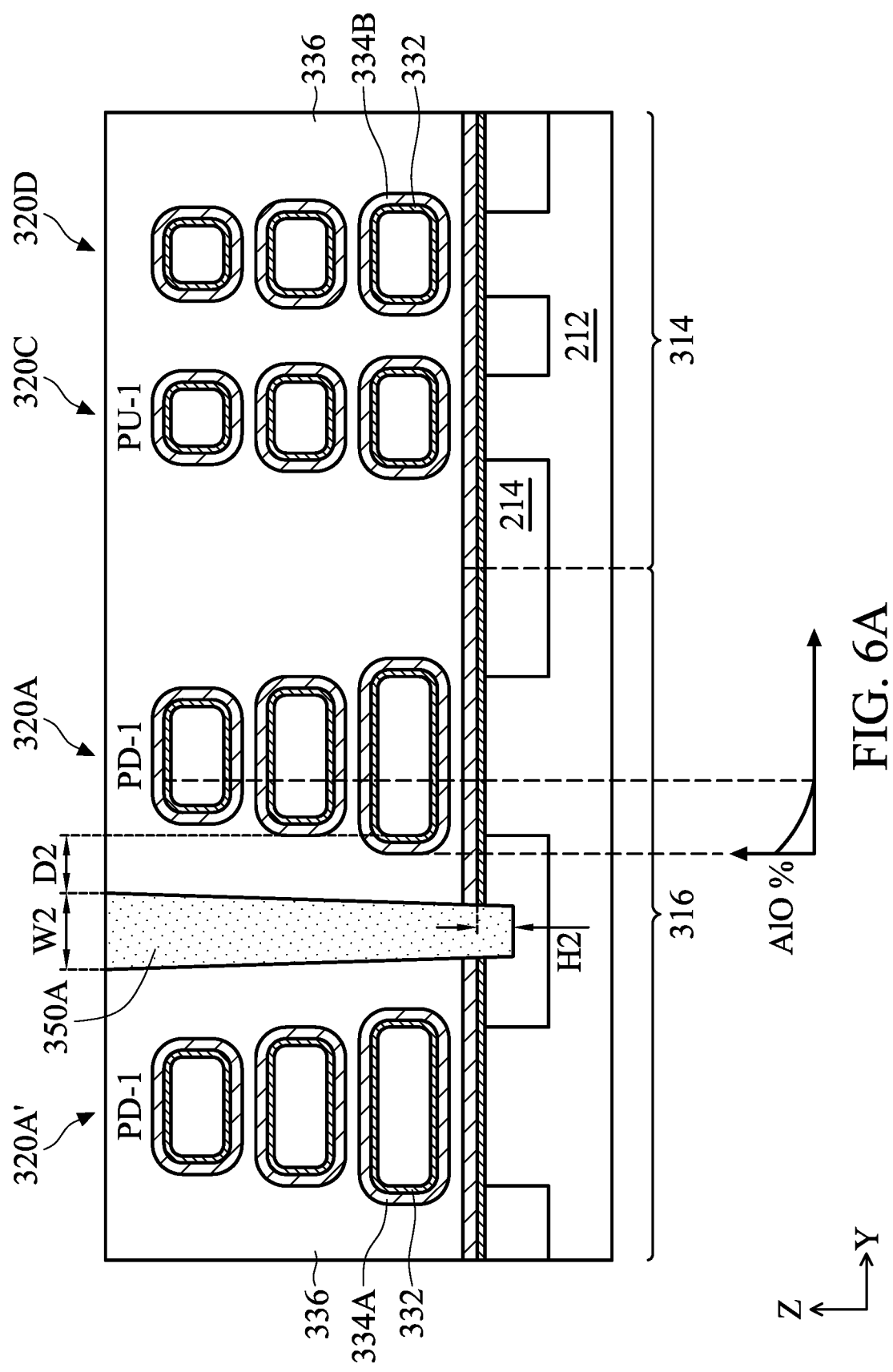
Figure 6B:
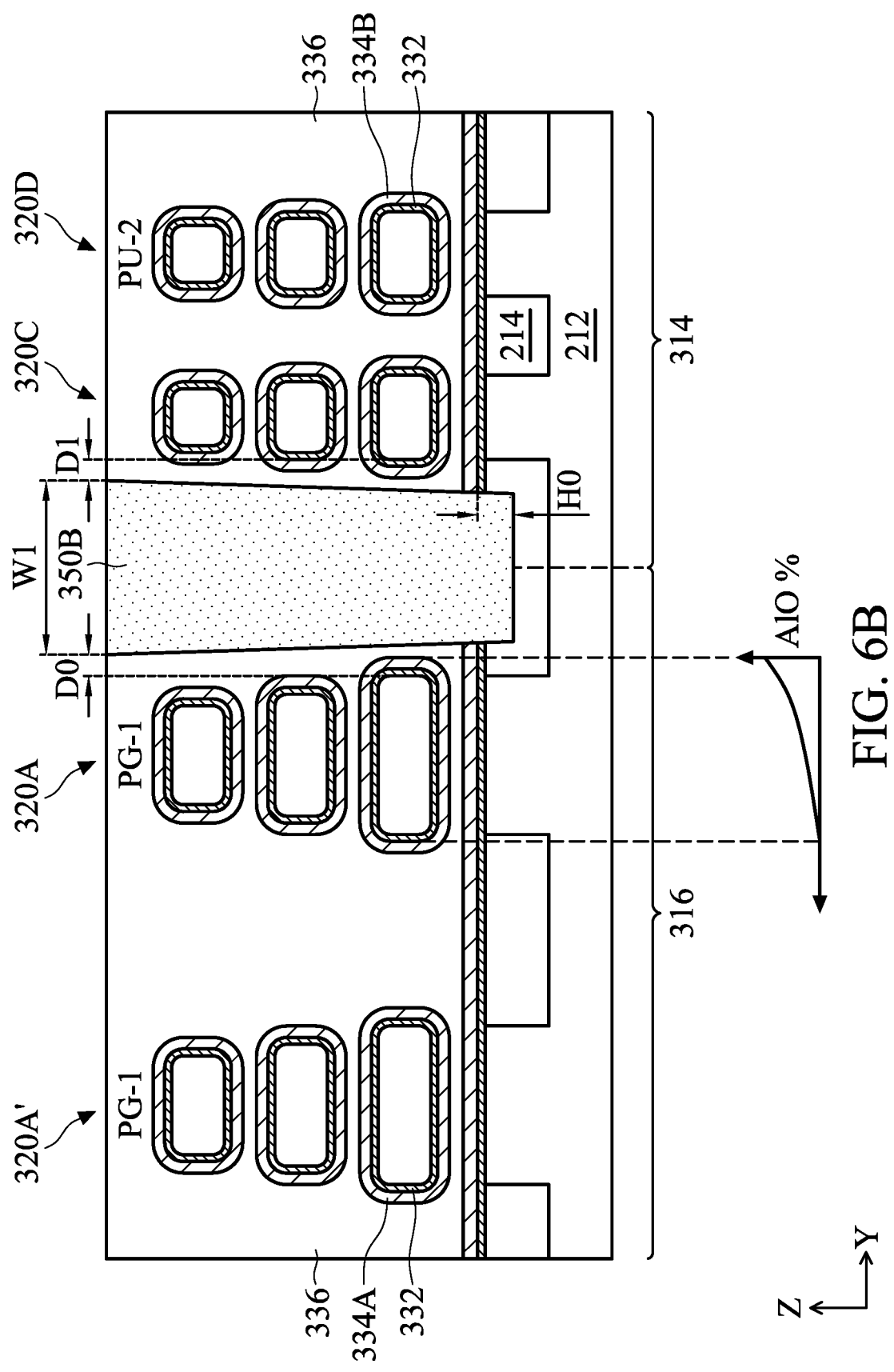

FIGS. 6A and 6B illustrate cross-sectional views along A-A line and B-B line in FIG. 4, respectively, according to an implementation of transistors with GAA devices, in which active regions of transistors are provided by vertically stacked nanostructures (e.g., nanowire or nanosheet). In the illustrated embodiment, fin-like structures (also referred to as fin) 320A', 320A, 320C, and 320D provide vertically stacked nanosheets as active regions of respective GAA transistors. Gate structures wrap around and engage each nanosheet. The various dimensions and distances of dielectric features 350A and 350B are the same as or similar to what have been discussed above with reference to dielectric features 350A and 350B in FIGS. 5A and 5B. Such similar aspects are not repeated below in the interest of conciseness.

Figure 8:
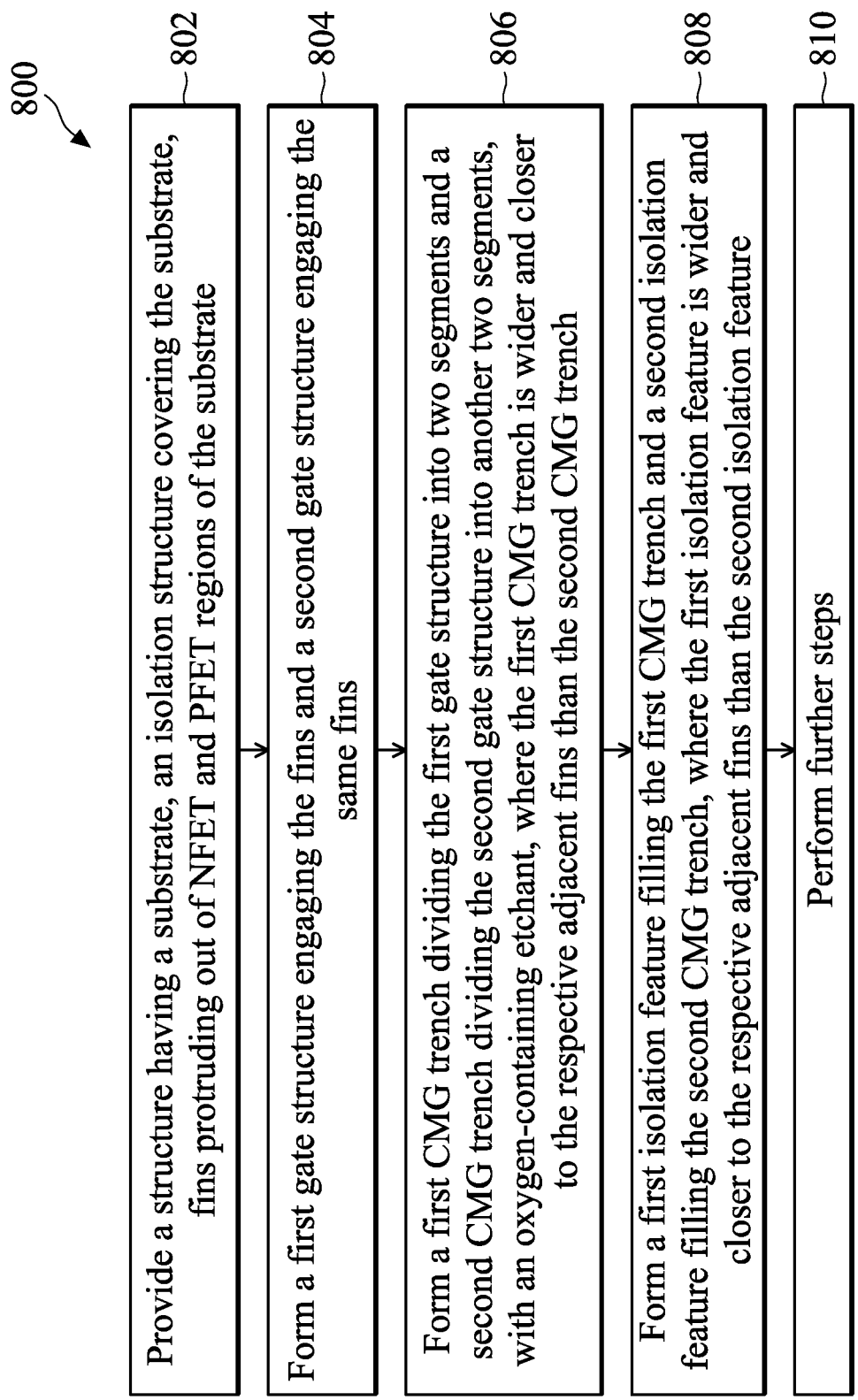
FIG. 8 shows a flow chart of a method for forming semiconductor devices, according to aspects of the present disclosure.

FIG. 8 is a flowchart illustrating a method 800 according to an embodiment of the present disclosure. The method 800 includes a step 802, in which a structure having a substrate, an isolation structure covering the substrate, fins protruding out of NFET and PFET regions of the substrate is formed. The method 800 includes a step 804 of forming a first gate structure engaging the fins and a second gate structure engaging the same fins. The method 800 includes a step 806 of forming a first cut-metal-gate trench dividing the first gate structure into two segments and a second cut-metal-gate trench dividing the second gate structure into another two segments, in which an oxygen-containing etchant is used. The first cut-metal-gate trench has a larger critical dimension (CD) and closer to an adjacent fin than the second cut-metal-gate trench, and deeper into the isolation structure underneath as well. Due to the larger CD of the first cut-metal-gate trench, more oxygen-containing etchant enters the first cut-metal-gate trench. Sidewalls of the first cut-metal-gate trench may be more tapered than the second cut-metal-gate trench. The method 800 includes a step 808 of forming a first gate isolation feature by filling the first cut-metal-gate trench with a dielectric material and a second gate isolation feature by filling the second cut-metal-gate trench with the dielectric material. The method 800 includes a step 810 of performing further steps to complete the fabrication of the semiconductor device. For example, the method 800 may form gate contacts, source/drain contacts, via layers and metal layers above the gate contacts to form metal interconnections in connecting various transistors to form a complete IC.

Although not intended to be limiting, one or more embodiments of the present disclosure provide many benefits to a semiconductor device and the formation thereof. For example, embodiments of the present disclosure provide gate isolation features with different dimensions and different distances to adjacent active regions to fine tune threshold voltages of n-type transistors. During forming some relatively larger gate isolation features, more oxygen diffuses to the adjacent active regions and oxidizes aluminum in work function layers, which in turn increases threshold voltages and compensates threshold voltage difference due to aluminum diffusion occurred in some other transistors. Further, embodiments of the present disclosure can be readily integrated into existing semiconductor manufacturing processes.

In one exemplary aspect, the present disclosure is directed to a Static Radom Access Memory (SRAM) cell. The SRAM cell includes a pass-gate transistor, wherein the pass-gate transistor includes a first active region extending lengthwise along a first direction and a first gate structure engaging the first active region, wherein the first gate structure extends lengthwise along a second direction perpendicular to the first direction; a first isolation feature abutting the first gate structure; a pull-down transistor, wherein the pull-down transistor includes a second active region extending lengthwise along the first direction and a second gate structure engaging the second active region, wherein the second gate structure extends lengthwise along the second direction; and a second isolation feature abutting the second gate structure, wherein the first isolation feature is spaced from the first active region of the pass-gate transistor for a first distance along the second direction, and the second isolation feature is spaced from the second active region of the pull-down transistor for a second distance along the second direction that is larger than the first distance. In some embodiments, a ratio of the second distance over the first distance ranges from about 1.5:1 to about 3:1. In some embodiments, the pass-gate transistor and the pull-down transistor are arranged along the first direction. In some embodiments, the pass-gate and pull-down transistors are disposed between the first and second isolation features. In some embodiments, the first and second active regions share a same fin-like structure. In some embodiments, the fin-like structure includes two fins. In some embodiments, the fin-like structure includes nanosheets that are vertically stacked, and each of the first and second gate structures wraps around each of the nanosheets. In some embodiments, each of the first and second gate structures includes a work function layer having a same metal element, and an oxide containing the metal element has a concentration in the work function layer of the first gate structure that is larger than in the work function layer of the second gate structure. In some embodiments, the concentration of the oxide in the work function layer of the first gate structure is at least about 50% larger than in the work function layer of the second gate structure. In some embodiments, the concentration of the oxide in the work function layer of the second gate structure is substantially zero.

In another exemplary aspect, the present disclosure is directed to a semiconductor device. The semiconductor device includes a fin-like structure extending lengthwise along a first direction; a first gate structure extending lengthwise along a second direction different from the first direction; a first isolation feature dividing the first gate structure into a first segment and a second segment, wherein the first segment of the first gate structure engages the fin-like structure; a second gate structure extending lengthwise along the second direction; and a second isolation feature dividing the second gate structure into a third segment and a fourth segment, wherein the fourth segment of the second gate structure engages the fin-like structure, wherein the first and second gate structures include a same metal element, and an oxide containing the metal element has a concentration in the first gate structure larger than in the second gate structure. In some embodiments, the metal element has a concentration in the first gate structure larger than in the second gate structure. In some embodiments, the metal element is aluminum and the oxide containing the metal element is aluminum oxide. In some embodiments, the oxide containing the metal element has a gradient distribution in the first gate structure which reduces at a larger distance away from the first isolation feature. In some embodiments, the first isolation feature has a first width along the second direction, the second isolation feature has a second width along the second direction, and the first width is larger than the second width. In some embodiments, a ratio of the first width over the second width ranges from about 1.2:1 to about 2:1. In some embodiments, an edge-to-edge distance between the first isolation feature and the fin-like structure is smaller than an edge-to-edge distance between the second isolation feature and the fin-like structure.

In yet another exemplary aspect, the present disclosure is directed to a method of forming a semiconductor device. The method includes providing a substrate, the substrate having a first region and a second region, each of the first and second regions extending lengthwise in a first direction; forming an active region over the first region, the active region extending lengthwise in the first direction; forming a first gate structure and a second gate structure over the active region, each of the first and second gate structure extending above both the first and second regions; etching the first gate structure, thereby forming a first opening dividing the first gate structure into a first segment over the first region and a second segment over the second region; etching the second gate structure, thereby forming a second opening dividing the second gate structure into a third segment over the first region and a fourth segment over both the first and second regions, wherein an edge-to-edge distance between the first opening and the active region is smaller than an edge-to-edge distance between the second opening and the active region; and filling the first and second openings with a dielectric material. In some embodiments, the etching of the first gate structure and the etching of the second gate structure both include applying an oxygen-containing etchant, such that a larger portion of a metal in the first gate structure is oxidized than in the second gate structure. In some embodiments, the first region is a p-well region and the second region is an n-well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Static Radom Access Memory (SRAM) cell, comprising:
    a pass-gate transistor, wherein the pass-gate transistor includes a first active region extending lengthwise along a first direction and a first gate structure engaging the first active region, wherein the first gate structure extends lengthwise along a second direction perpendicular to the first direction;
    a first isolation feature abutting the first gate structure;
    a pull-down transistor, wherein the pull-down transistor includes a second active region extending lengthwise along the first direction and a second gate structure engaging the second active region, wherein the second gate structure extends lengthwise along the second direction; and
    a second isolation feature abutting the second gate structure and spaced apart from the first gate structure in a top view of the SRAM cell,
    wherein the first isolation feature is spaced from the first active region of the pass-gate transistor for a first distance along the second direction, the second isolation feature is spaced from the second active region of the pull-down transistor for a second distance along the second direction that is larger than the first distance, and a bottom surface of the first isolation feature is lower than a bottom surface of the second isolation feature.

2. The SRAM cell of claim 1, wherein a ratio of the second distance over the first distance ranges from about 1.5:1 to about 3:1.

3. The SRAM cell of claim 1, wherein the pass-gate transistor and the pull-down transistor are arranged along the first direction.

4. The SRAM cell of claim 1, wherein the pass-gate and pull-down transistors are disposed between the first and second isolation features.

5. The SRAM cell of claim 1, wherein the first and second active regions share a same fin-like structure.

6. The SRAM cell of claim 5, wherein the fin-like structure includes two fins.

7. The SRAM cell of claim 5, wherein the fin-like structure includes nanosheets that are vertically stacked, and each of the first and second gate structures wraps around each of the nanosheets.

8. The SRAM cell of claim 1, wherein each of the first and second gate structures includes a work function layer having a same metal element, wherein an oxide containing the metal element has a concentration in the work function layer of the first gate structure that is larger than in the work function layer of the second gate structure.

9. The SRAM cell of claim 8, wherein the concentration of the oxide in the work function layer of the first gate structure is at least about 50% larger than in the work function layer of the second gate structure.

10. The SRAM cell of claim 8, wherein the concentration of the oxide in the work function layer of the second gate structure is substantially zero.

11. A semiconductor device, comprising:
a fin-like structure extending lengthwise along a first direction;
a first gate structure extending lengthwise along a second direction different from the first direction;
a first isolation feature dividing the first gate structure into a first segment and a second segment, wherein the first segment of the first gate structure engages the fin-like structure;
a second gate structure extending lengthwise along the second direction; and
a second isolation feature dividing the second gate structure into a third segment and a fourth segment, wherein the fourth segment of the second gate structure engages the fin-like structure,
wherein the first and second gate structures include a same metal element, and an oxide containing the metal element has a concentration in the first gate structure larger than in the second gate structure,
wherein the oxide containing the metal element has a gradient distribution in the first gate structure which reduces at a larger distance away from the first isolation feature.

12. The semiconductor device of claim 11, wherein the metal element has a concentration in the first gate structure larger than in the second gate structure.

13. The semiconductor device of claim 11, wherein the metal element is aluminum and the oxide containing the metal element is aluminum oxide.

14. The semiconductor device of claim 11, wherein the first isolation feature has a first width along the second direction, the second isolation feature has a second width along the second direction, and the first width is larger than the second width.

15. The semiconductor device of claim 14, wherein a ratio of the first width over the second width ranges from about 1.2:1 to about 2:1.

16. The semiconductor device of claim 14, wherein an edge-to-edge distance between the first isolation feature and the fin-like structure is smaller than an edge-to-edge distance between the second isolation feature and the fin-like structure.

17. A Static Radom Access Memory (SRAM) cell, comprising:
a pass-gate transistor, wherein the pass-gate transistor includes a first active region extending lengthwise along a first direction and a first gate structure engaging the first active region, wherein the first gate structure extends lengthwise along a second direction perpendicular to the first direction;
a first isolation feature extending lengthwise in the first direction and in direct contact with the first gate structure;
a pull-down transistor, wherein the pull-down transistor includes a second active region extending lengthwise along the first direction and a second gate structure engaging the second active region, wherein the second gate structure extends lengthwise along the second direction; and
a second isolation feature extending lengthwise in the first direction and in direct contact with the second gate structure but free of direct contact with the first gate structure,
wherein a width of the first isolation feature is larger than a width of the second isolation feature, and a bottom surface of the first isolation feature is lower than a bottom surface of the second isolation feature.

18. The SRAM cell of claim 17, wherein the first isolation feature is spaced from the first active region of the pass-gate transistor for a first distance along the second direction, the second isolation feature is spaced from the second active region of the pull-down transistor for a second distance along the second direction, and the second distance is larger than the first distance.

19. The SRAM cell of claim 17, wherein the first gate structure includes an aluminum oxide of a first concentration, the second gate structure includes an aluminum oxide of a second concentration, and the first concentration is larger than the second concentration.

20. The semiconductor device of claim 11, wherein the first isolation feature is wider than the second isolation feature measured in the second direction.

* * * * *